United States Patent
Jarvis et al.

(10) Patent No.: US 6,297,644 B1
(45) Date of Patent: Oct. 2, 2001

(54) MULTIPURPOSE DEFECT TEST STRUCTURE WITH SWITCHABLE VOLTAGE CONTRAST CAPABILITY AND METHOD OF USE

(75) Inventors: Richard W. Jarvis; Iraj Emami, both of Austin; John L. Nistler, Martindale; Michael G. McIntyre, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/262,240

(22) Filed: Mar. 4, 1999

(51) Int. Cl.[7] ............. H01H 31/02; G01R 31/305; G01R 31/308; H04N 7/18; G06K 9/03

(52) U.S. Cl. ............ 324/537; 324/751; 324/753; 348/131; 382/141

(58) Field of Search .................. 324/537, 751, 324/753, 750, 752; 348/125, 126, 87, 131; 382/141, 147

(56) References Cited

U.S. PATENT DOCUMENTS

| | | |
|---|---|---|
| 3,751,647 | 3/1971 | Maeder et al. . |
| 3,842,491 | 10/1974 | Depuy et al. . |
| 3,983,479 * | 9/1976 | Lee et al. ............. 324/537 |
| 4,347,479 | 8/1982 | Cullet . |
| 4,670,710 * | 6/1987 | Beha et al. ............. 324/72.5 |
| 4,855,253 | 8/1989 | Weber . |
| 5,051,690 | 9/1991 | Maly et al. . |
| 5,159,752 * | 11/1992 | Mahant-Shetti et al. ........... 438/18 |
| 5,514,974 | 5/1996 | Bouldin . |
| 5,576,223 | 11/1996 | Zeininger et al. . |
| 5,773,315 | 6/1998 | Jarvis . |
| 5,801,394 | 9/1998 | Isobe . |

(List continued on next page.)

OTHER PUBLICATIONS

Modeling of Test Structures for Efficient Online Defect Monitoring Using a Digital Tester. Christopher Hess et al., Proc. IEEE 1994 Int. Conference on Microelectronic Test Strategies, vol. 7, Mar. 1994.*

Hess et al., "Modeling of Real Defect Outlines for Defect Size Distribution and Yield Prediction," *Proc. IEEE 1993 Int. Conference on Microelectronic Test Structures*, vol. 6, Mar. 1993.

Hess et al., "Drop In Process Control Checkerboard Test Structure for Efficient Online Process Characterization and Defect Problem Debugging," *Proc. IEEE 1994 Int. Conference on Microelectronic Test Structures*, vol. 7, Mar. 1994.

(List continued on next page.)

*Primary Examiner*—Safet Metjahic
*Assistant Examiner*—Anjan K Deb
(74) *Attorney, Agent, or Firm*—Kevin L. Daffer; Conley, Rose & Tayon P.C.

(57) ABSTRACT

A test structure which includes alternating grounded and floating conductive lines may be used to test the formation of conductive features on an integrated circuit topography. During irradiation of the conductive lines from an electron source, the grounded conductive lines will appear darker than the floating conductive lines when the test structure is inspected. If a short occurs between the conductive lines, due to an extra material defect, the portion of the floating line in the vicinity of the defect will also appear darkened. If an open appears along a grounded line, the non-grounded portion of the grounded line will be glowing. The grounded conductive lines are preferably grounded through a depletion-mode transistor. By applying a voltage to the transistor, the grounded line may be disconnected from ground, allowing electrical testing of the test structure. The electrical testing may be used to validate the voltage contrast methodology, as well as determine the approximate size of defects formed on the test structure.

30 Claims, 9 Drawing Sheets

U.S. PATENT DOCUMENTS

| | | |
|---|---|---|
| 5,821,761 | 10/1998 | Shida et al. . |
| 5,959,459 | 9/1999 | Satya et al. . |
| 6,016,062 | 1/2000 | Nicollian et al. . |
| 6,121,065 | 9/2000 | Wong et al. . |

OTHER PUBLICATIONS

Hess et al., "Modeling of Test Structures for Efficient Online Defect Monitoring Using a Digital Tester," *Proc. IEEE 1994 Int. Conference on Microelectronic Test Structures*, vol. 7, Mar. 1994.

Hess, "Strategy to Optimize the Development, Use, and Dimension of Test Structures to Control Defect Appearance in Backend Process Steps," *Proc. IEEE/SEMI 1994 Advanced Semiconductor Manufacturing Conference*, vol. 5, Nov. 1994.

Hess et al., "Defect Parameter Extraction in Backend Process Steps Using a Multilayer Checkerboard Test Structure," *Proc. IEEE 1995 Int. Conference on Microelectronic Test Structures*, vol. 8, Mar. 1995.

Hess et al., "Influence of Short Circuits on Data of Contact & Via Open Circuits Determined by a Novel Weave Test Structure," *Proc. IEEE 1995 Int. Conference on Microelectronic Test Structures*, vol. 8, Mar. 1995.

Hess et al., "Resistance Modeling of Test Structures for Accurate Fault Detection in Backend Process Steps Using a Digital Tester," *Proc. IEEE 1995 Int. Conference on Microelectronic Test Structures*, vol. 8 Mar. 1995.

Hess et al., "A Digital Tester Based Measurement Methodology for Process Control in Multilevel Metallization Systems," *Proc. SPIE's 1995 Microelectronic Manufacturing Conference*, vol. 2637, Oct. 1995.

Hess et al., "Control of Application Specific Interconnection on Gate Arrays Using an Active Checkerboard Test Structure," *Proc. IEEE 1996 Int. Conference on Microelectronic Test Structures*, vol. 9 Mar. 1996.

Hess et al., "Correlation Between Particle Defects and Electrical Faults Determined with Laser Scattering Systems and Digital Measurements on Checkerboard Test Structures," *Proc. SPIE's 1996 Microelectronic Manufacturing Conference*, vol. 2874, Oct. 1996.

Hess et al., "Issues on the Size amd Outline of Killer Defects and their Influence on Yield Modeling," *Proc. IEEE/SEMI 1996 Advanced Semiconductor Manufacturing Conference*, vol. 7, Nov. 1996.

Hess et al., "Determination of Defect Size Distribution Based on Electrical Measurements at a Novel Harp Test Structure," *Proc. IEEE 1997 Int. Conference on Microelectronic Test Structures*, vol. 10, Mar. 1997.

Hess et al., Issues on Short Circuits in Large On–Chip Power MOS–Transistors Using a Modified Checkerboard Test Structure, *Proc. IEEE 1997 Int. Conference on Microelectronic Test Structures*, vol. 10 Mar. 1997.

Hess et al., "Customized Checkerboard Test Structures to Localize Interconnection Point Defects," *Proc. 1997 VLSI Mulitlevel Interconnection Conference*, vol. 14, Jun. 1997.

Hess et al., "Comparison of Defect Size Distributions Based on Electrical and Optical Measurement Procedures," *Proc. IEEE/SEMI 1997 Advanced Semiconductor Manufacturing Conference*, vol. 8, Sep. 1997.

Hess et al., "Defect Cluster Analysis to Detect Equipment Specific Yield Loss Based on Yield–to–Area Calculations," *Proc. SPIE's 1997 Microelectronic Manufacturing Conference*, vol. 3216, Oct. 1997.

Hess et al., "Strategy to Disentangle Multiple Faults to Identify Random Defects within Test Structures", *Proc. IEEE 1998 Int. Conference on Microelectronic Test Structures*, vol. 11, Mar. 1998.

Hess et al., "Wafer Level Defect Density Distribution Using Checkerboard Test Structures," *Proc. IEEE 1998 Int. Conference on Microelectronic Test Structures*, vol. 11, Mar. 1998.

Hess et al., "Novel Methodology to Include all Measured Extension Values per Defect to Improve Defect Size Distributions," *Proc. IEEE/SEMI 1998 Advanced Semiconductor for Manufacturing Conference*, vol. 9, Sep. 1998.

\* cited by examiner

MULTIPURPOSE DEFECT TEST STRUCTURE WITH SWITCHABLE VOLTAGE CONTRAST CAPABILITY AND METHOD OF USE

BACKGROUND OF THE INVENTION

1. Field of the Invention

This invention relates to semiconductor fabrication and more particularly to a test structure for testing the accuracy at which conductive structures are formed using both visual and electronic inspection techniques.

2. Description of the Relevant Art

High yields are essential to the profitable manufacture of integrated circuits. Yield prediction, used to estimate the manufacturing yield of a new integrated circuit, is accordingly a very valuable tool in assuring that such manufacture will be economically successful.

A wafer fabrication process typically forms multiple integrated circuits upon each of several silicon wafers processed simultaneously. As the integrated circuits formed on a given silicon wafer are identical copies of a given product, the silicon wafer is sometimes referred to as a product wafer. An individual integrated circuit is also called a "chip" or a "die". Following wafer fabrication, the die are subjected to functional testing, then separated. Fully functional die are typically packaged and sold as individual units.

In general, the yield associated with a product wafer manufactured using a particular wafer fabrication process depends upon: 1) the number of steps in the wafer fabrication process, 2) the number of defects introduced during each processing step, and 3) the vulnerability of the features formed during a given processing step to the defects introduced during the processing step.

A defect is simply a flaw caused by an imperfect manufacturing process. Only some of the defects associated with a given step are "catastrophic" defects, or defects which prevent an integrated circuit containing the defect from performing its intended function. It is well known that most defects occur during microstructure patterning steps. Photolithography is used to accomplish such patterning steps, during which light passing through a pattern on a mask transfers the pattern to a layer of a light-sensitive material deposited on the surface of a silicon wafer. The layer of the light-sensitive material is developed in a manner analogous to the developing of exposed photographic film. Exposure to light makes certain regions of the layer of light-sensitive material soluble. The developing step removes the soluble regions, forming holes in the layer of light-sensitive material. Select regions of the upper surface of the silicon wafer are exposed to an etchant or to dopant atoms through the holes during a subsequent processing step. Small particles (i.e., particulates) on the surface of the mask or on the surface of the photoresist layer, which block or diffuse light, cause imperfect pattern registrations (i.e., imperfect feature formations). Particulates may be present in the ambient air, introduced by processing personnel, suspended in liquids and gases used during processing, or generated by processing equipment. In general, the vulnerability of a particular feature to a given defect is inversely proportional to the physical dimensions of the feature. Thus the smaller the physical dimensions of a feature formed using photolithography, the greater the likelihood that a particulate of a given size will cause a catastrophic defect.

There are two basic types of defects which may occur when conductive layers are formed on an integrated circuit topography. Extra material defects ("EMDs") may occur when the conductive structures include material extending beyond the predefined boundaries. Such material may extend to another conductive structure causing a "short" to be formed between the two conductive structures. Missing material defects ("MMDs") may occur when a conductive structure is formed which is missing some of its conductive material. Such a defect may cause the formation of an "open" conductive structure in which the continuity of a conductive structure is broken.

EMDs and MMDs may be detected using test structures. Typically, these test structures include a number of electrically testable conductive lines. Electrical probing of these conductive lines may be used to determine the presence of shorts between two or more conductive lines or the presence of opens in a conductive line. FIG. 1A depicts a typical test structure used to test for EMDs. The test structure includes a first conductive comb 10 with a test pad 12 and a second conductive comb 20 with a test pad 22. The combs are formed in close proximity to each other. If no EMDs are present, electrical probing of pads 12 and 22 will show no electrical connection (e.g., high resistance). If, however, a conductive EMD 30 having a sufficient size to bridge at least two of the conductive lines is present, as depicted in FIG. 1B, a short may be formed between the two conductive lines, thus allowing an electrical connection to be formed. When pads 12 and 22 are simultaneously probed an electrical connection (e.g., a low resistance) may be detected.

FIG. 2A depicts a serpentine structure which may be used to test for MMDs in a conductive structure. The test structure includes a serpentine conductive line 40 with test pads 42 and 44 formed at both ends of the line. If no MMDs are present, electrical probing of pads 42 and 44 should show conductivity between the two pads. If, however, an MMD 50 is present, as depicted in FIG. 2B, sufficient material may be absent such that the connectivity of the conductive line is broken. This MMD may be detected when electrical probing of the pads reveals a decrease in conductivity between the pads.

A disadvantage of these types of test structures is that every line has to be individually probed to check for these defects. If a large number of test structures are present, the electrical testing of each of these test structures may take an undesirable length of time. It would be desirable to develop a test structure and method which can more rapidly determine the presence of defects. Such a structure and method would be beneficial in rapidly detecting the presence of unacceptable defects during a production run.

SUMMARY OF THE INVENTION

The problems outlined above are in large part solved by a test structure which includes alternating grounded and floating conductive lines. Floating conductive lines are defined to be lines which are neither grounded nor powered during the optical testing of the test structure. This test structure allows for a rapid optical inspection of the test structure to determine if defects are present. When the test structure is irradiated with electrons, conductive lines which are floating will emit more electrons than grounded conductors. This occurs because the grounded conductors absorb a portion of the electrons directed toward them, thus emitting fewer electrons than the floating conductive lines. If a defect is present which causes a short between a grounded and an ungrounded line, the two lines will emit about the same amount of electrons. During a voltage contrast inspection of the test structure, the lines may appear as an alternating series of bright (i.e., emitting more electrons) and darkened (i.e., emitting fewer electrons) conductive lines. If a defect is present on the test structure, this condition may be detected by inspecting the test structure while the structure is being irradiated with electrons. If a floating and grounded line are shorted to each other, at least a portion of the floating line in the vicinity of the defect will appear to be darkened, thus readily signaling, by visual scan, the presence of a defect.

An advantage of this test structure is that the presence and location of the defect may be readily determined. If a short occurs between a floating and a grounded line, the floating line will appear darkened in the vicinity of the short. Thus, when the region in which the defect is present is scanned, a change in the visual appearance of a conductive line will occur. This method allows not only the detection of EMDs, but also allows a rapid method of determining the location of the defect. This avoids inspecting the entire test structure. Voltage contrast inspection allows a much coarser scan since a much larger area of the test structure will appear altered due to the presence of a defect.

This test structure also allows for the detection of small and/or low contrast defects. Small defects are defects which are too small to be observed using standard voltage contrast inspections and/or optical inspections. Low contrast defects are defects which may cause changes which are hard to detect due to very low contrast between the defect and the non-defective conductive line. Both small defects and low contrast defects may be difficult to observe during voltage contrast and/or optical inspections. Thus, the defects may be missed. The above described test structure allows a very large change to be produced regardless of the size of the defect, i.e. a darkening of a line. Thus, even though a small or low contrast defect may not be detectable using an optical inspection, when the test structure is analyzed using a voltage contrast inspection, the defect may be readily apparent because of the overall change in the appearance of the entire conductive line. Thus, the test structure allows the presence of a defect to be accentuated, increasing the chances the defect will be detected.

In an embodiment, the test structure includes at least two conductive lines. The first conductive line is preferably coupled to ground. The second conductive line is preferably floating. The lines are formed on the upper surface of an integrated circuit topography. A transistor may be coupled to the first conductive line such that the transistor couples the first conductive line to the ground. The transistor is preferably a depletion-mode transistor. When a voltage is applied to the transistor, the transistor is configured to disconnect the first conductive line from the ground, thus rendering the first conductive line floating. The transistor may be coupled to a pad. The pad is preferably configured such that a voltage applied to the pad causes the transistor to disconnect the first conductive line from ground. An advantage of placing a transistor between the conductive line and the ground is that the line can be switched from a grounded to floating state. This allows the test structure to be used for a variety of testing techniques, including non-grounded electrical testing. Examples of test methods with which the above described test structure may be used include, but are not limited to, voltage contrast inspectability, basic particle size distribution, grounded electrical testing, and non-grounded electrical testing.

The first conductive line is preferably formed in a comb-like structure. The first conductive line preferably includes a main body portion with projections extending from the main body portion. The second conductive line is preferably routed in a serpentine fashion around the projections of the first conductive line. The second conductive line may be positioned such that a distance between the first and second conductive lines is constant.

The test structure may also include additional conductive lines. A third conductive line coupled to ground and a fourth floating line may also be incorporated into the test structure. The third line is preferably coupled to ground through a transistor. The transistor is preferably a depletion-mode transistor. When a voltage is applied to the transistor, the transistor is configured to disconnect the third conductive line from the ground, thus rendering the third conductive line floating. The fourth conductive line is preferably a floating line.

When four conductive lines are incorporated into the test structure, two of the lines, preferably the first and the fourth conductive lines, are comb-like lines. Both the first and fourth lines include projections extending out from a main portion of the conductive lines. The projections extend toward and away from the opposing conductive line. Sandwiched between the comb like first and fourth lines, the second and third conductive lines are routed in serpentine fashion between the projections of the first and fourth lines. Preferably the spacing between all of the lines is substantially constant such that at any given point the distance between neighboring lines is substantially the same. The use of comb like and serpentine lines allows a greater surface area of the integrated circuit topography to be covered while maintaining a minimal number of conductive lines.

The width of the individual conductive lines may be varied to allow testing of the production of wide conductive lines to coupled to narrow conductive lines on the integrated circuit topography. Alternatively, the conductive lines may be formed such that all of the conductive lines have substantially the same width and a constant spacing between the conductive lines. By forming conductive lines having the same width and spacing, the test structure may be used for particle size testing, as well as defect detection. The conductive lines are preferably formed from a conductive material during the formation of conductive features on other parts of the integrated circuit topography. Examples of conductive materials include, but are not limited to, conductive metals, such as aluminum, titanium, cobalt, etc., and silicided polysilicon.

In another embodiment, testing pads may be incorporated into the test structure. The test pads are attached to each of the conductive lines to allow electrical testing of the conductive lines. The test pads are preferably connected to the conductive lines to allow testing of shorts between the lines and to find opens in the conductive lines. The pads are preferably placed at opposed ends of a conductive line to allow testing of the continuity of the entire conductive line.

The above described test structure may be used to test for defects which may occur during the formation of conductive features on an integrated circuit topography. Typically, the test structure is formed substantially simultaneously with the formation of conductive features on production chips. Alternatively, the test structure may be formed on an entire wafer using the same processing conditions which are used for production wafers. The test structure may be used to study the accuracy of the processing steps used for the formation of the conductive features.

In an embodiment, a test structure which includes at least one grounded conductive line and at least one floating conductive line is formed. The test structure may include additional lines, transistors and test pads as described above.

After formation of the test structure, the structure is irradiated with electrons. The second line will emit electrons and will thus appear to "glow". The first conductive line, however, will absorb a portion of the irradiated electrons, because it is grounded, and thus emit fewer electrons than the floating line. During irradiation of the test structure the test structure may be inspected to determine if the conductive lines are glowing or darkened. If no defect is present, a pattern of glowing and darkened lines will be seen. If a defect is present, the defect may span the space between a floating line and a grounded line, causing the floating line to become grounded. In this case, instead of glowing, a portion of the conductive line, near to the short, will now be darkened.

MMDs in the grounded conductive line may also be found using a voltage contrast method. If a defect is present on a conductive line which is grounded, such that the continuity of the conductive line is broken, a portion of the conductive line will now be floating. During a voltage contrast inspection of the test structure, the floating portion of the conductive line will glow, while the grounded portion of the conductive line will be darkened. By inspecting a portion of the test structure near the point of grounding, and a portion of the test structure farther away from the point of grounding, an open in a grounded conductive line may be detected. The scanned portions may represent only a fraction of the total area of the test structure. This offers an advantage over conventional optical inspections which may require inspecting the entire test structure to determine the presence of opens in a conductive line. By minimizing the area required for inspecting, the test structure may be used to quickly validate a process step involving the formation of conductive features.

When defects are detected in a test structure using an inspection, as described above, the presence of defects may be electrically verified. By incorporating test pads into the structure, the presence of EMDs and MMDs may be detected electrically. EMDs may be detected by electrically testing for connectivity between the conductive lines of the test structure. MMDs may be detected by testing for continuity of a conductive line. The grounded conductive lines, as described above, may also include a transistor which is configured to disconnect the grounded lines from the ground when a voltage is applied to the transistor. The use of transistors allows both grounded and non-grounded electrical testing method to be performed.

In another embodiment, the test structure may be used to determine the approximate size range of a defect. The presence of an EMD may be detected during the visual inspection of the test structure while irradiating the test structure with electrons. The test structure preferably includes at least four conductive lines, with alternate conductive lines connected to ground. The conductive lines preferably are formed at a predetermined spacing from each other and have a predetermined width. Preferably, the spacing between each of the conductive lines is the same. It is also preferable that the width of the conductive lines is the same. After an EMD is detected, the test structure may be electrically tested to determine the possible size range of the defect. By determining which of the conductive lines are spanned by the defect, an approximate size range of the defect may be determined.

BRIEF DESCRIPTION OF THE DRAWINGS

Other objects and advantages of the invention will become apparent upon reading the following detailed description and upon reference to the accompanying drawings in which.

Figure 1A:
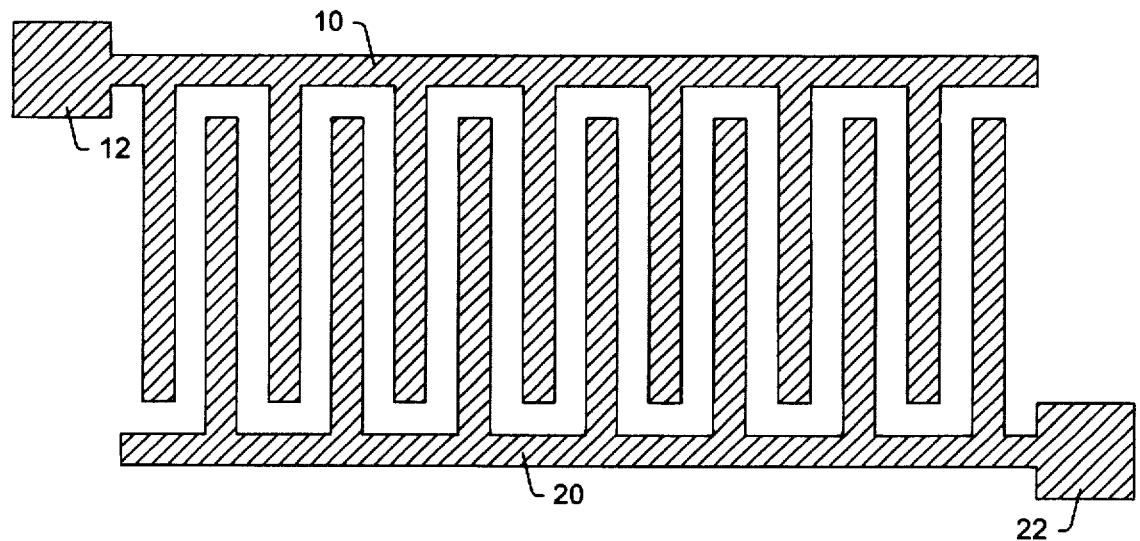
FIGS. 1A and 1B depict a top view of a prior art test structure for determining the presence of EMDs.
Figure 1B:
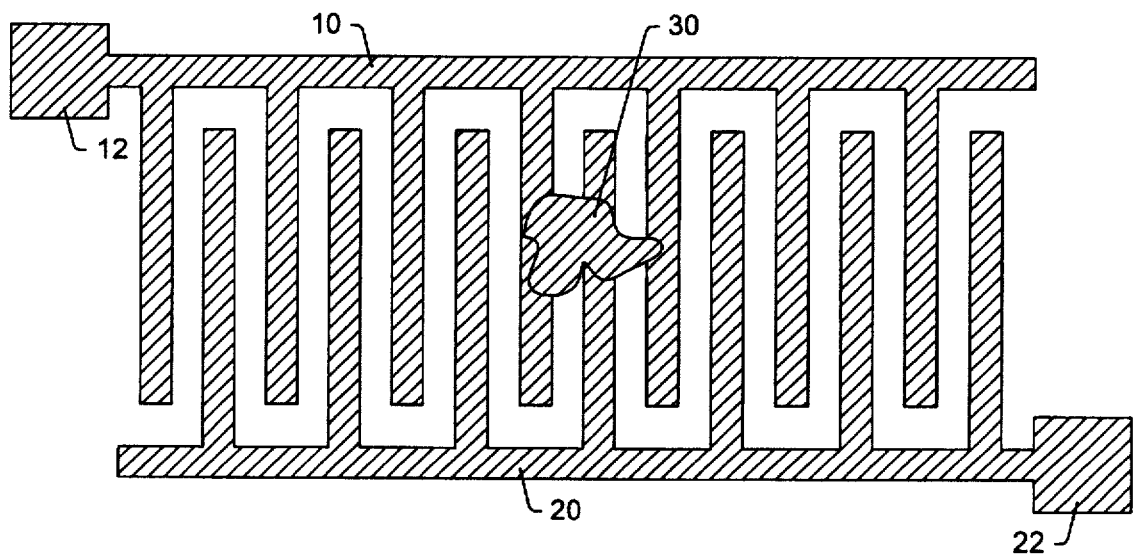
Figure 2A:
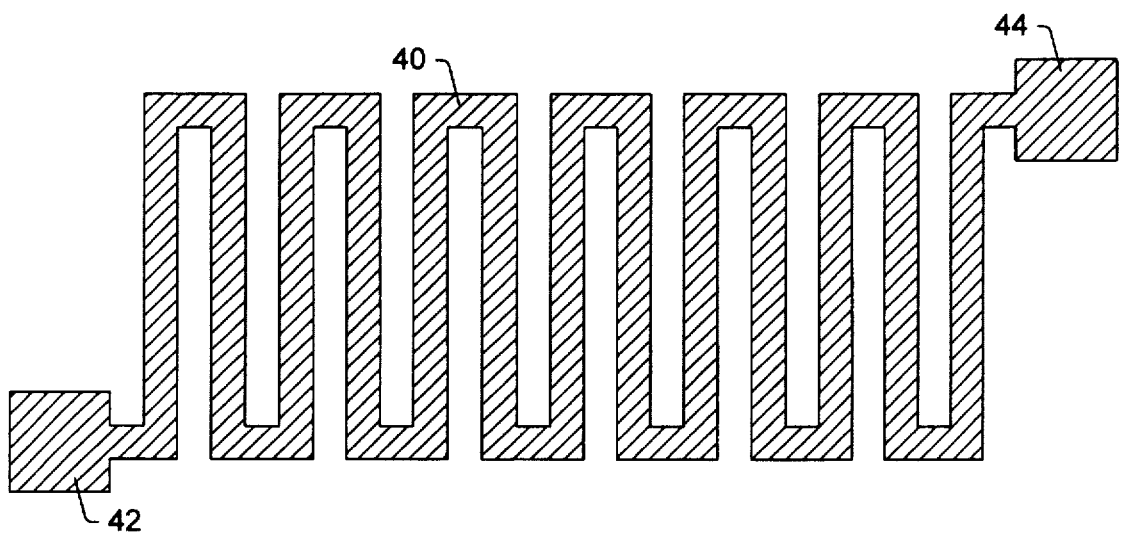
FIGS. 2A and 2B depict a top view of a prior art test structure for determining the presence of MMDs.
Figure 2B:
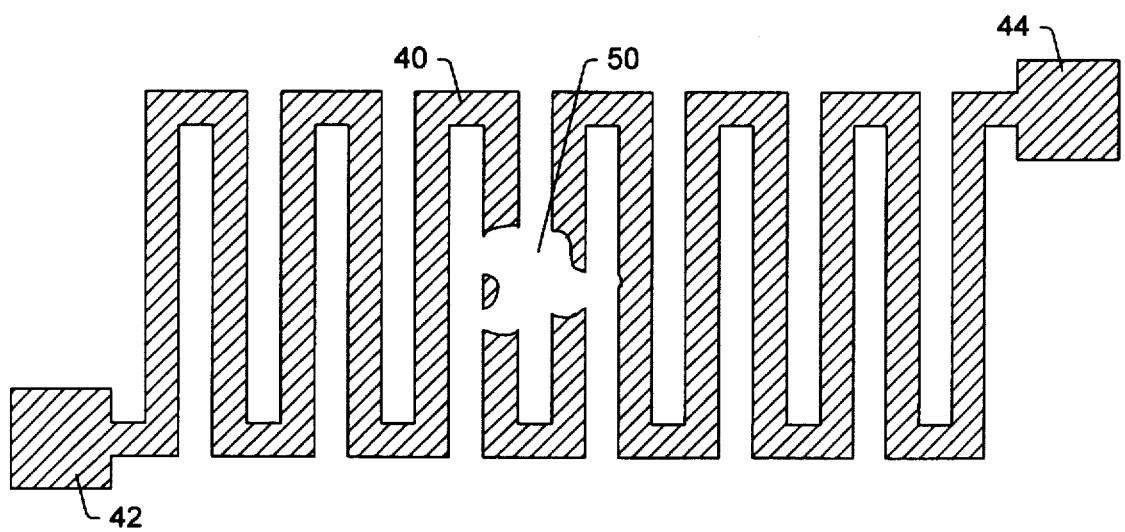

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 3:
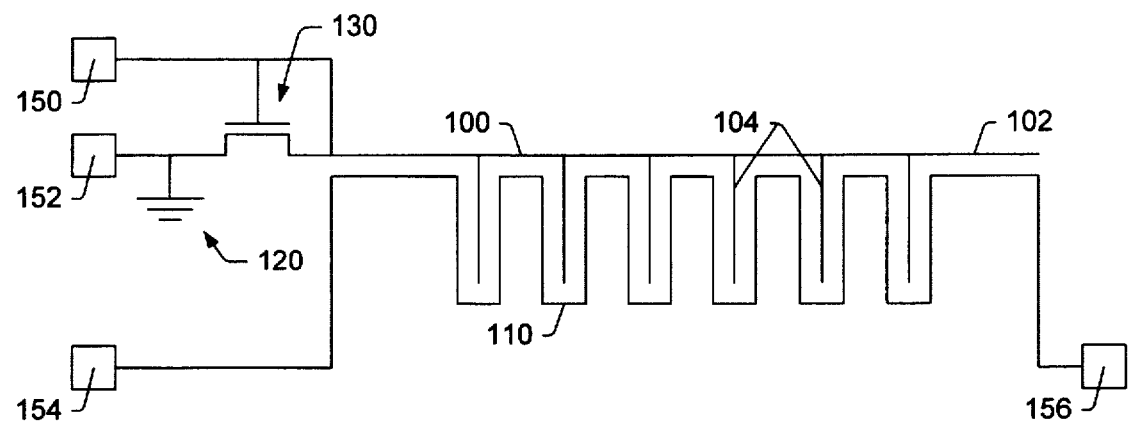
FIG. 3 depicts a schematic view of a test structure which include two conductive lines.

A schematic diagram of a test structure which includes at least two conductive lines is depicted in FIG. 3. The first conductive line 100 is coupled to ground 120. First conductive line 100 preferably includes a main portion 102 with projections 104 extending from the main portion. These projections 104 give first conductive line 100 a comb-like appearance. The second conductive line 110 is non-grounded, i.e., floating. The second conductive line is preferably routed in a serpentine fashion around the projections 104 and along the main portion 102 of the first conductive line. The second conductive line may be positioned such that a distance between the first and second conductive lines is substantially constant. The widths of the conductive lines, as well as the spacing between them, are preferably selected to correspond to the linewidths and separation between conductive lines that may be formed in production regions of a wafer. As used in this application, "production region" describes a region of a wafer that is designed to be a part of an operable integrated circuit intended to function as part of an electronic device targeted for use by a user of the die. Both the first and second conductive lines are formed on an integrated circuit topography. The conductive lines are preferably formed from either a conductive metal, e.g., aluminum, titanium, etc., or silicided polysilicon.

Figure 4:
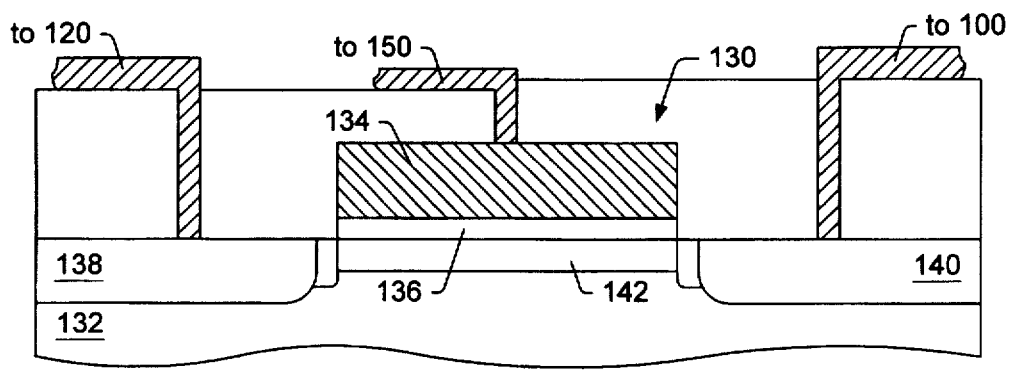
FIG. 4 depicts a cross sectional view of a depletion-mode transistor coupled to a conductive line.

A transistor 130 may be coupled to first conductive line 100 such that the transistor couples the first conductive line to ground 120. Transistor 130 is preferably a depletion-mode MOSFET transistor. An n-channel depletion-mode MOSFET or a p-channel depletion-mode MOSFET may be used. FIG. 4 depicts a partial cross-sectional view of an integrated circuit topography upon which a depletion-mode MOSFET is formed. The depletion-mode MOSFET includes a gate conductor 134, a gate dielectric 136, a source region 138, a drain region 140, and a channel region 142. The channel region 142 is diffused between the source and the drain, with the same type of impurity as used for the source/drain diffusion. Source region 138 is coupled to ground 120, drain region 140 is coupled to the first conductive line 100, and the gate 134 is coupled to a pad 150 configured to receive an electrical probe. When the gate to source voltage is zero (i.e., $V_{gs}=0$), the source and drain regions are connected via the channel region, thus coupling the first conductive line to ground 120. If the gate to source voltage is increased, i.e., made negative for an n-channel transistor or positive for a p-channel transistor, the channel region will become less conductive. The gate to source cutoff voltage is defined as the voltage at which the current between the source and drain is reduced to a negligible value. Thus, by applying a voltage to the gate of the transistor equal to or greater than the gate to source cutoff voltage, the first conductive line 100 may be disconnected from ground 120. By disconnecting first conductive line 100 from ground 120, the first conductive line will become a floating line.

The transistor may be coupled to a pad 150. Pad 150 is configured to receive an electrical probe. An electrical probe may be used to apply a voltage which is sufficient to cause the transistor to disconnect the first conductive line from ground 120. An advantage of placing a depletion-mode transistor between the conductive line and the ground is that the conductive line may be switched from a grounded to floating state. By switching the line from grounded to floating, electrical inspections may be performed. This allows the test structure to be used for a variety of testing methods. Examples of test methods with which the above-described test structure may be used include, but are not limited to, voltage contrast inspection, optical inspection, basic particle size distribution, grounded electrical testing, and non-grounded electrical testing.

The above-described test structure may be used in a voltage contrast inspection test method to test for defects which may have occurred during the formation of conductive features on an integrated circuit topography. The test structure is preferably formed on a test area of an integrated circuit topography using the same process steps as used on a production die area of the wafer. In this manner, process induced defects produced in the production die areas may be duplicated in the test structure area.

After the test structure is formed, the test structure is irradiated with electrons. Preferably, the test structure is irradiated with electrons using a scanning electron microscope ("SEM"). The SEM includes an electron source which is used to create a beam of electrons that is accelerated toward a targeted area of the test structure. As the electrons hit the target area they cause an emission of electrons from the conductive lines. These emitted electrons are collected by a detector. By monitoring the pattern of electrons emitted by the test structure, the absence or presence of defects may be determined. Typically, the pattern of electrons emitted by the test structure is compared with a test structure of identical design in an adjacent production area. Thus, the inspection typically involves substantially simultaneously inspecting two adjacent test structures. Differences noted between the test structures will alert the inspector that a defect may be present in one of the test structures. Alternatively, a pattern of electron emission from a test structure which is free of defects may be stored in the memory of the inspection tool as a "standard test structure". As each of the test structures is inspected, the test structure is compared to the standard test structure. Differences noted between the inspected test structure and the standard test structure may alert the inspector that a defect may be present.

The electric fields at the sample surface can significantly influence the amount of electrons emitted by the sample. If a conductive line is grounded, a substantial number of electrons which impact the grounded line will be absorbed and transferred to the ground. This absorption of electrons will result in the grounded conductive line appearing much darker than the floating conductive line. As used herein, the term "glowing" refers to the appearance of a floating conductive line when irradiated with electrons. The term "darkened" will herein refer to the appearance of a grounded conductive line when irradiated with electrons. Thus, inspecting the above-described test structure with an SEM will, in the absence of defects, show a pattern which includes a glowing line and a dark line. The grounded first conductive line will appear as a dark line and the floating second conductive line will appear as a glowing line.

Figure 5A:
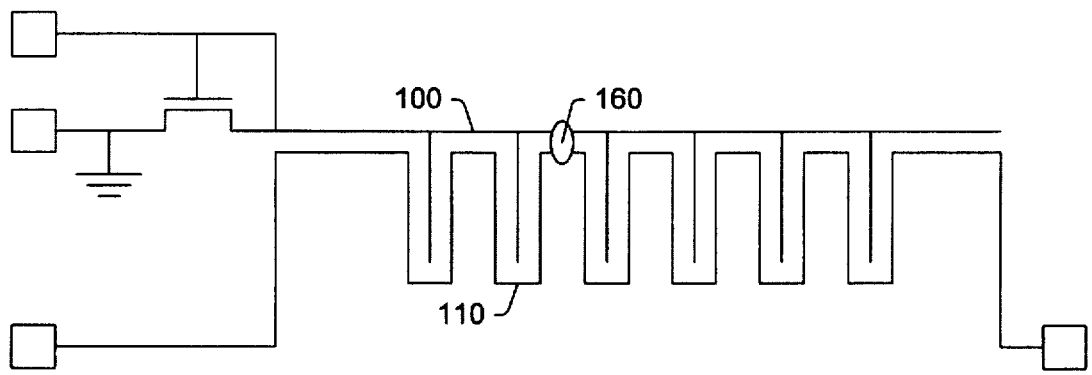
FIG. 5A depicts a schematic view of a test structure which includes two conductive lines, wherein an EMD causes a short between the conductive lines.

If a defect is present, however, the lines may not show the expected pattern. If an EMD 160 is present in the test structure which causes first conductive line 100 and second conductive line 110 to become shorted, as depicted in FIG. 5A, second conductive line 110 will become grounded. At least a portion of the floating second conductive line 110 will now become darkened due to the bridging of the lines by the defect. Typically only a portion of the line in the vicinity of the defect will become darkened under low power scanning conditions. Lower power scanning conditions include conditions in which the incident power of the irradiating electrons drops below about 1000 e.v. in a test area having a diameter of about 50 μm. These low power scanning conditions may be achieved by lowering the power of the incident electrons or by increasing the diameter of the test area. Under typical voltage contrast scanning conditions, the entire floating second conductive line will now become darkened due to bridging of the first and second conductive lines by the defect. Typical scanning conditions include conditions in which the incident power of the irradiating electrons drops is at or above about 1000 e.v. and the test area has a diameter at or below about 50 μm. This method allows not only the detection of EMDs, but also allows a rapid method of determining the location of the defect. Traditional methods require inspecting of the entire test structure at a resolution that allows optical detection of the defect. Voltage contrast inspection allows a much coarser scan since a much larger area of the test structure will appear altered due to the presence of a defect.

Figure 5B:
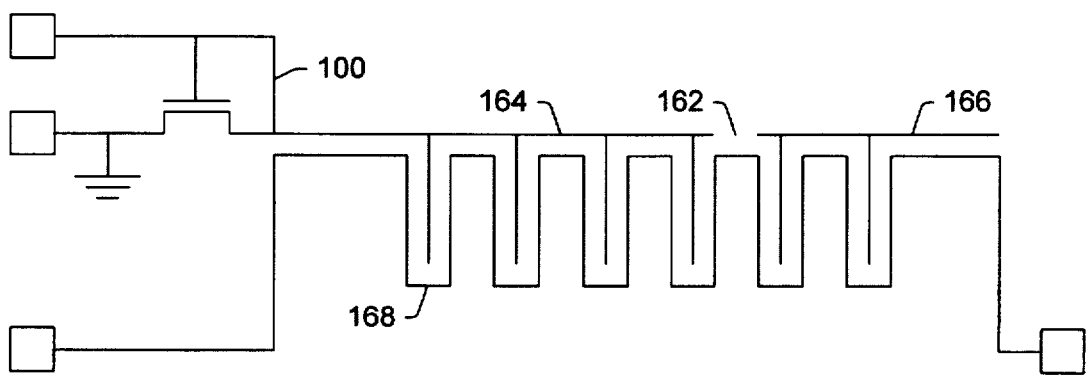
FIG. 5B depicts a schematic view of a test structure which includes two conductive lines, wherein an MMD causes an open in one of the conductive lines.

If an MMD 162 is present along first conductive line 100, as depicted in FIG. 5B, then only a portion 164 of the first conductive line will be grounded. The other portion 166 is now disconnected from ground. When the test structure is scanned using an SEM, only the grounded portion 164 of first conductive line 100 will appear dark. The floating portion 166 will glow in a manner similar to second conductive line 110. Thus, during SEM inspection of the test structure, inspecting the conductive line may rapidly allow an open defect to be detected. A sudden change from darkened to glowing indicates not only the presence of an MMD, but also the location of the defect.

Figure 6:
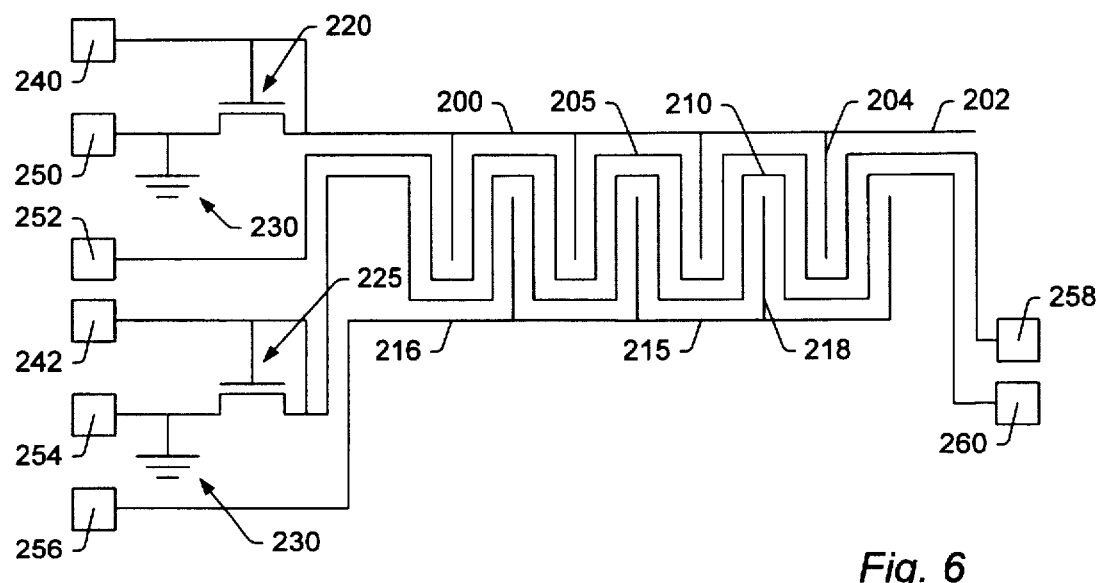
FIG. 6 depicts a schematic view of a test structure which includes four conductive lines.

In another embodiment, a test structure may include four conductive lines. A schematic diagram of a test structure which includes four conductive lines is depicted in FIG. 6. The first conductive line 200 is formed on an integrated circuit topography and coupled to ground 230. First conductive line 200 preferably includes a main portion 202 with projections 204 extending from the main portion. These projections 204 give first conductive line 200 a comb like appearance. First conductive line 200 is preferably coupled to a first transistor 220. First transistor 220 is preferably a depletion-mode MOSFET transistor. An n-channel depletion-mode MOSFET or a p-channel depletion-mode MOSFET may be used. The transistor is configured as described above. By applying a voltage to the gate of the transistor, first conductive line 200 may be disconnected from ground 230. By disconnecting first conductive line 200 from ground 230, the first conductive line will become a floating line. First transistor 220 may be coupled to pads 240 and 250. Pads 240 and 250 are configured to receive an electrical probe. An electrical probe may be used to apply a voltage to pad 240 which is sufficient to cause the transistor to disconnect the first conductive line from ground 230. Pad 250 may be used for grounded electrical testing of the first conductive line.

The second conductive line 205 is formed on the integrated circuit topography and is a non-grounded, i.e., floating line. Second conductive line 205 is preferably routed in a serpentine fashion around the projections 204 and along the main portion 202 of first conductive line 200, as well as around the projections 218 and main portion 216 of fourth conductive line 215. Second conductive line 205 may be positioned such that a distance between the first and second conductive lines is substantially constant along and between projections 204, as well as along a portion of main portion 202 of first conductive line 200. The spacing between the first and second conductive lines may increase at the ends of the lines to allow connection of the second conductive line to pads 252 and 258. Pads 252 and 258 are configured to receive an electrical probe. Pads 252 and 258 may be used for electrical testing of the conductive lines.

The third conductive line 210 is formed on the integrated circuit topography and coupled to ground 230. Third conductive line 210 is preferably routed in a serpentine fashion around the projections 204 and along the main portion 202 of first conductive line 200, as well as around the projections 218 and main portion 216 of the fourth conductive line 215. Third conductive line 210 may be positioned such that a distance between the first and third, and the fourth and third conductive lines, is substantially constant along and between the projections and main portions of the first and fourth conductive lines. A second depletion mode transistor 225 is preferably coupled to the third conductive line. An n-channel depletion-mode MOSFET or a p-channel depletion-mode MOSFET may be used. The transistor is preferably configured as described above. By applying a voltage to the gate of second transistor 225, third conductive line 210 may be disconnected from ground 230. By disconnecting third conductive line 210 from ground 230, the third conductive line will become a floating line. Second transistor 220 may be coupled to pads 242, 254 and 260. Pads 242, 254 and 260 are configured to receive an electrical probe. An electrical probe may be used to apply a voltage to pad 242 which is sufficient to cause the transistor to disconnect the third conductive line from ground 230. Pad 254 may be used for grounded electrical testing of the third conductive line.

The fourth conductive line is formed on the integrated circuit topography and is a non-grounded, i.e., floating line. Fourth conductive line 215 preferably includes a main portion 216 with projections 218 extending from the main portion. These projections 218 give fourth conductive line 215 a comb like appearance. Fourth conductive line is coupled to pad 256, which is configured to receive an electrical probe. Pad 256 may be used for electrical testing of the test structure.

After the test structure is formed, the test structure is irradiated with electrons. Preferably, the test structure is irradiated with electrons using a scanning electron microscope ("SEM"). By monitoring the pattern of electrons emitted by the test structure, the absence or presence of defects may be determined.

In the absence of a defect, the lines should have an alternating glowing-darkened pattern. The grounded first and third conductive lines should appear dark, while the second and fourth floating lines should appear glowing. If a defect is present, however, the lines may not show the expected pattern. If an EMD is present in the test structure which causes first conductive line 200 and second conductive line 205 to become shorted, second conductive line 205 will become grounded and a portion of the line will appear darkened. Similarly, a defect which causes a short between the second and third conductive lines will also cause a portion of the second conductive line to become darkened.

A defect which causes a short to occur between the third and fourth lines may cause a portion of the fourth conductive line to become darkened. Defects may also be sufficient in size to span three or more conductive lines. If an EMD contacts the second conductive line and the fourth conductive lines portions of both the second and fourth conductive lines will become darkened due to grounding through the first and/or third conductive lines.

If an MMD is present along either the first or third conductive line, then only a portion of the first conductive line will be grounded. The other portion is now disconnected from ground. When the test structure is scanned using an SEM only the grounded portion of either the first conductive line 200 or the third conductive line 210 will appear dark. The floating portion of these lines will glow in a manner similar to second and fourth conductive lines.

Figure 7:
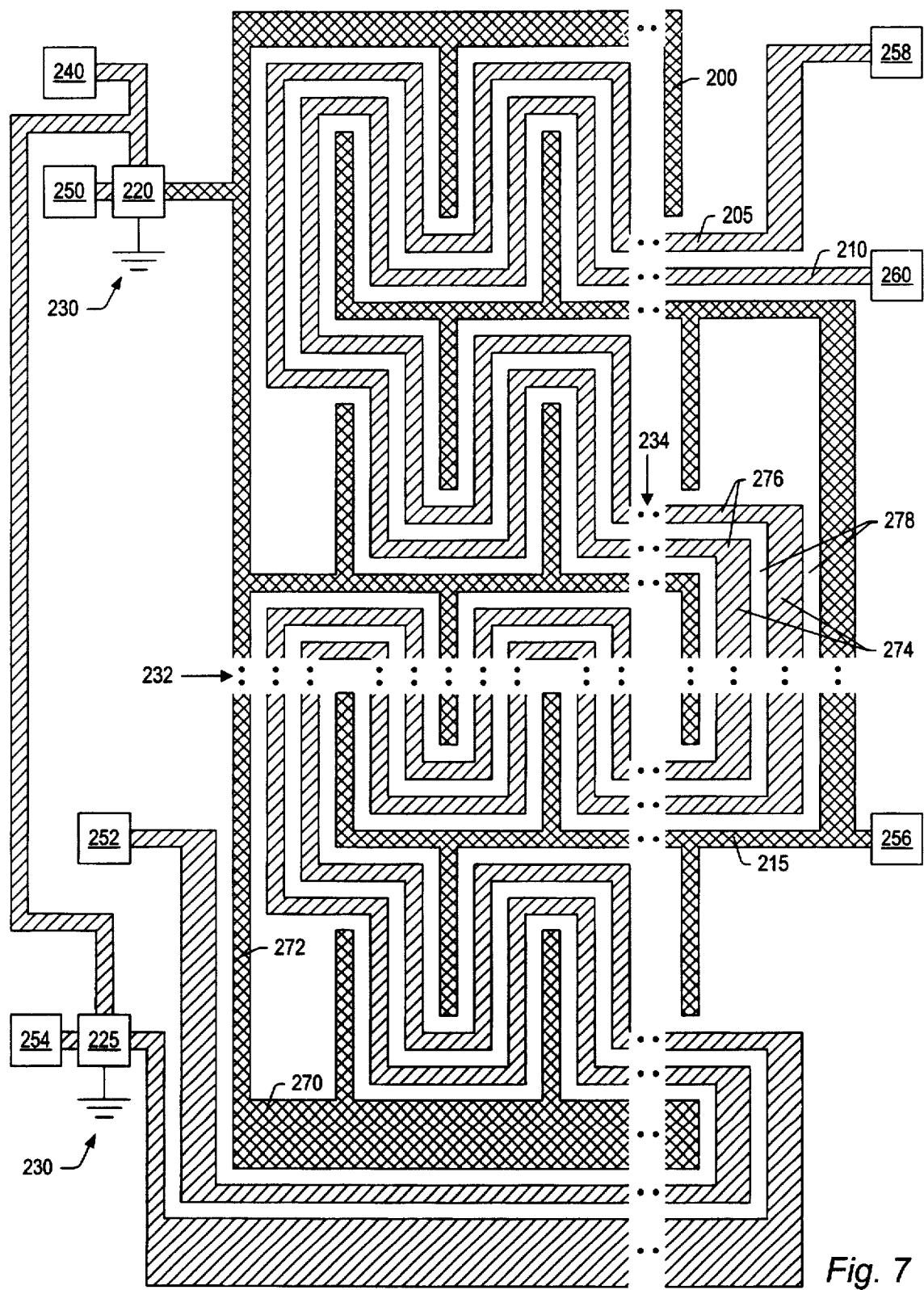
FIG. 7 depicts a top view of a test structure layout, formed on an integrated circuit topography, which includes four conductive lines.

Turning to FIG. 7, an overhead view of a test structure layout, which includes four conductive lines, is depicted. The conductive lines 200, 205, 210, and 215 of the test structure are preferably formed in a test region of an integrated circuit topography while conductive lines of the same material are being formed in a production region of the wafer. The size of the test structure may vary. It should be understood that the vertical and horizontal patterns depicted may be extended over the integrated circuit topography until a desired area of the topography is covered by the test structure. For example, the test structure may be extended along the vertical axis through region 232 and along the horizontal axis at region 234. The area of the test structure may vary from about 900 $\mu m^2$ to an area that covers the entire wafer. Typically, the area of the test structure is limited to the amount of space required for formation of the electrical testing pads. Preferably, the width of the conductive lines and the spacing between the lines is chosen to be the same as the conductive lines being formed in the production area of a wafer or during a production run.

First conductive line 200 is a comb like line as described above. First conductive line 200 is coupled to ground 230 via first transistor 220. First transistor 220 is coupled to pad 240, which is configured to receive an electrical probe. The first conductive line may be disconnected from ground 230 by applying a voltage to pad 240. The width of first conductive line 200 may vary. For example, portion 270 of first conductive line 200 may be formed having a significantly wider width than portion 272. This variation in width is preferably done to allow testing of the coupling of narrow conductive lines to wider conductive lines to examine minimum printed spaces.

Second and third conductive lines are preferably formed to meander through the comb like projections of the first conductive line 200 and fourth conductive line 215. Second conductive line 205 is preferably a floating line. Third conductive line 210 is preferably coupled to ground 230 through second transistor 225. Second transistor 205 is preferably coupled to pad 240. Pad 240 may then be used to activate first transistor 220 and second transistor 225, allowing disconnection of the first and third conductive lines from ground using a single pad 240. The width of second and third conductive lines, 205 and 210, may also vary. For example, narrow portions 276 of second and third conducive lines may be coupled to wider portions 274 of these lines. Second and third conductive lines may also be coupled to test pads, 252, 258, and 260 to allow electrical testing of the conductive lines.

Fourth conductive line 215 is a comb-like line as described above. Fourth conductive line is preferably a floating line. The width of fourth conductive line 215 may vary as described above for the other conductive lines. The spacing between the lines is substantially constant. However, the spacing may be increased at portions of the test structure. For example, in region 278 the spacing between the second and third conductive lines is increased. This increase in width will allow testing of the spacing of the conductive lines.

Figure 8:
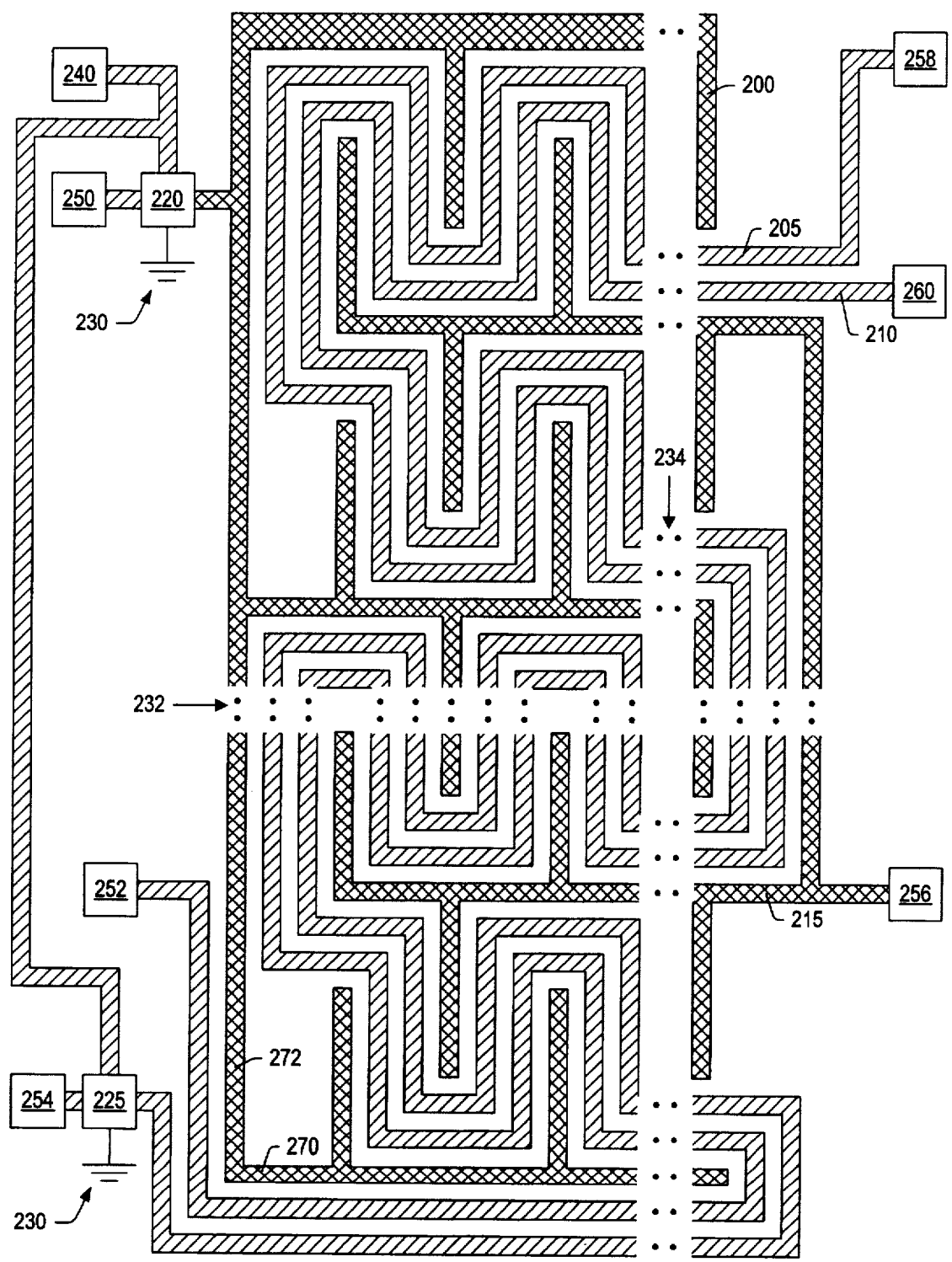
FIG. 8 depicts a top view of another embodiment of a test structure layout, formed on an integrated circuit topography, which includes four conductive lines.

The above described test structure may also be used to determine the defect size range of the defect. A test structure for use in determining the defect size range is depicted in FIG. 8. The structure is similar to that depicted in FIG. 7. The test structure includes four conductive lines, the first and third lines being coupled to ground through a pair of transistors. The conductive lines are formed having constant width, rather than a variable width as depicted in FIG. 7. The width of any of the conductive lines may differ from the other conductive lines, however, the width of an individual line is substantially constant. The spacing between any two given conductive lines may differ from the spacing between the other conductive lines, however, the spacing between any two conductive lines is substantially constant over the area of the test structure. In general, the width of the lines and the space between the lines is determined by the widths defined by the production steps. In an embodiment, a test structure for determining the defect size range for silicided polysilicon lines typically uses conductive lines having a width of about 0.18 μm and a spacing between the lines of about 0.25 μm. A test structure for determining defect size range for metal interconnect lines typically uses conductive lines having a width of about 0.3 μm and a spacing between the lines of about 0.3 μm. A test structure for determining defect size range for aluminum lines typically uses conductive lines having a width of about 0.35 μm and a spacing between the lines of about 0.45 μm.

After an EMD is detected, the test structure may be used to electrically determine the size of the defect. The defects are initially detected using the voltage contrast inspection method described earlier. After a defect is detected, the grounded first and third conductive lines are disconnected from ground by applying a voltage to pad 240. Testing for electrical connectivity between the conductive lines may then be performed. For example, resistance between conductive lines may be measured. In the absence of a defect, resistance between any two conductive lines should be relatively high. A conductive defect which causes a short between two conductive lines, however, may cause the resistance between the two lines to be decreased.

Figure 9A:
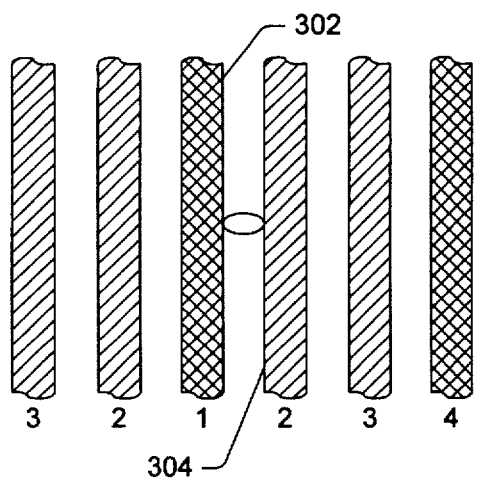
FIGS. 9A and 9B depict a top view of a test structure layout with an EMD causing a short between two adjacent conductive lines.
Figure 9B:
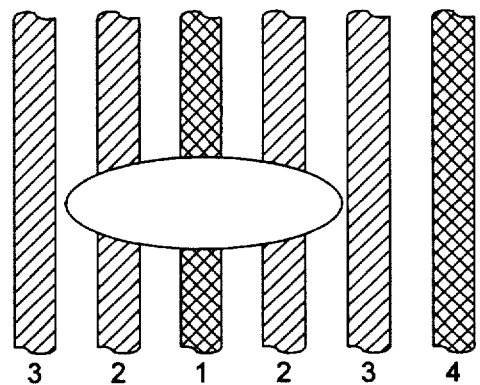
Figure 10A:
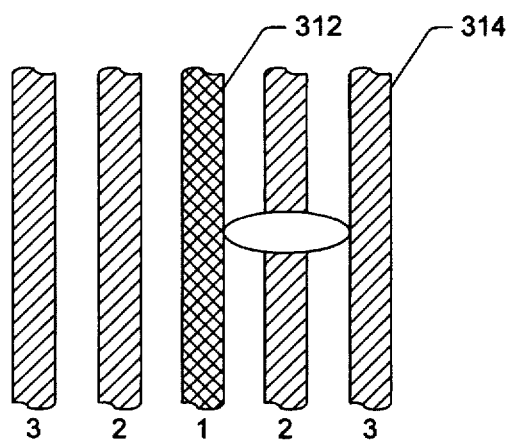
FIGS. 10A and 10B depict a top view of a test structure layout with an EMD causing a short between three adjacent conductive lines.
Figure 10B:
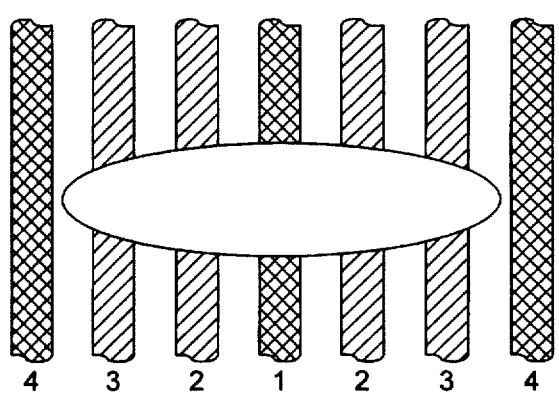
Figure 11:
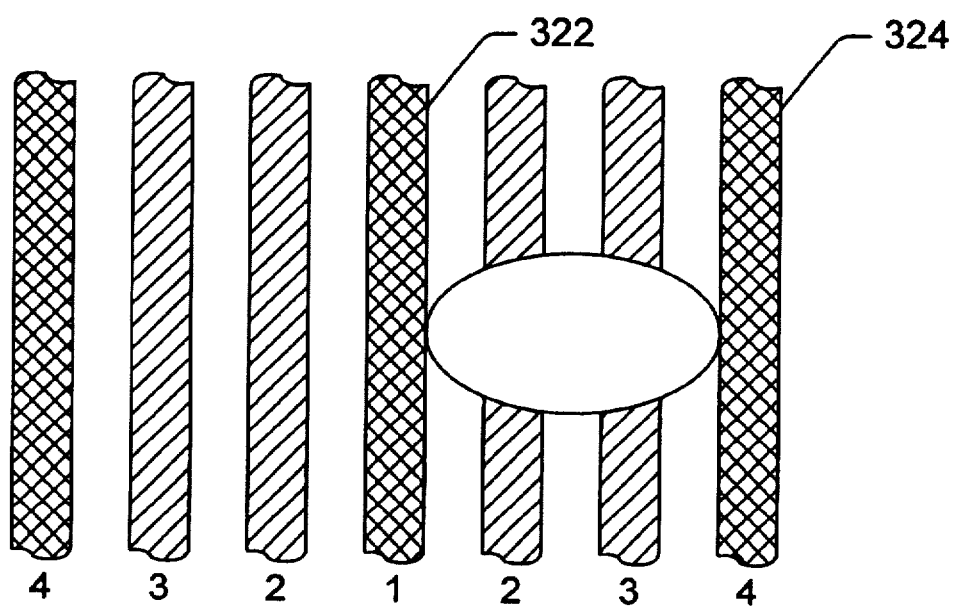
FIG. 11 depicts a top view of a test structure layout with an EMD causing a short between four adjacent conductive lines.

FIGS. 9, 10, and 11 depict how the above-described test structure may be used to determine the defect size range for defects of varying sizes. FIGS. 9A and 9B depict two situations where a defect causes a short between two conductive lines. The presence of this type of defect may be initially determined by an SEM inspection of the test structure. As described above, the presence of such a defect may be determined by noticing a breakdown in the alternating pattern of glowing and darkened conductive lines. After the defect has been detected, a series of electrical tests may be performed. These tests are typically performed after the grounded conductive lines are disconnected from ground by activating the depletion mode transistors. In the cases depicted in FIGS. 9A and 9B a short is electrically detected between adjacent conductive lines, i.e., lines 1 and 2. Further electrical testing will reveal that no shorts occur between the other conductive lines, i.e., lines 2 and 3, lines 3 and 4, or lines 1 and 4. Assuming the defect is roughly circular, the minimum possible length of a defect which causes a short between adjacent conductive lines is depicted in FIG. 9A. The defect extends from an outer surface 302 of conductive line 1 to an outer surface 304 of conductive line 2. The minimum possible length may be represented by the formula:

$$L_{min} \cong S_{12}$$

where $S_{12}$ is the distance between conductive lines 1 and 2. The maximum possible length of a defect, assuming the defect is roughly circular, which causes a short between adjacent conductive lines only, is depicted in FIG. 9B. The defect extends to a position which is just short of the third conductive line, spanning the first and second conductive lines. The maximum possible length may be represented by the formula:

$$L_{max} \cong S_{23} + W_2 + S_{12} + W_1 + S_{12} + W_2 + S_{23}$$

or $$L_{max} \cong 2S_{23} + 2W_2 + 2S_{12} + W_1$$

where $S_{23}$ is the distance between conductive lines 2 and 3, $W_2$ is the width of conductive line 2, $S_{12}$ is the distance between conductive lines 1 and 2, and $W_1$ is the width of the conductive line 1. Typically, the space between any two lines is equal to the width of any of the lines. Thus if $S_{23} = W_2 = S_{12} = W_1$, then the maximum possible length may be represented by the formula:

$$L_{max} \cong 7S \text{ (or } 7W)$$

Where S is the spacing between any adjacent lines and W is the width of any conductive line. Thus, if the line widths are about 0.25 μm and the spacing between the lines is about 0.25 μm, then $L_{min} \cong 0.25$ μm and $L_{max} \cong 1.75$ μm.

FIGS. 10A and 10B depict two situations where a defect causes a short between three conductive lines. The presence of this type of defect may be initially determined by an SEM inspection of the test structure. As described above, the presence of such a defect may be determined by noticing a breakdown in the alternating pattern of glowing and darkened conductive lines. After the defect has been detected, a series of electrical tests may be performed. In the cases depicted in FIGS. 9A and 9B a short is electrically detected between adjacent conductive lines, i.e., lines 1 and 2 and further a short may be detected between lines which are separated by another shorted conductive line. As depicted in FIGS. 10A and 10B, a short is detected between lines 1 and 2 and also between lines 1 and 3. Further electrical testing will reveal that no shorts occur between the lines 3 and 4 or lines 1 and 4.

Assuming the defect is roughly circular, the minimum possible length of a defect which causes a short between three adjacent conductive lines is depicted in FIG. 10A. The defect extends from an outer surface 312 of conductive line 1 to an outer surface 314 of conductive line 3. The minimum possible length may be represented by the formula:

$$L_{min} = S_{12} + W_2 + S_{23}$$

where $S_{12}$ is the distance between conductive lines 1 and 2, $W_2$ is the width of conductive line 2, and $S_{23}$ is the distance between conductive lines 2 and 3.

The maximum possible length of a defect, assuming the defect is roughly circular, which causes a short between three adjacent conductive lines, is depicted in FIG. 10B. The defect extends to a position which is just short of the fourth conductive line, spanning the first, second and third conductive lines. The maximum possible length may be represented by the formula:

$$L_{max} = S_{34} + W_3 + S_{23} + W_2 + S_{12} + W_1 + S_{12} + W_2 + S_{23} + W_3 + S_{34}$$

or $$L_{max} = 2S_{34} + 2W_3 + 2S_{23} + 2W_2 + 2S_{12} + W_1$$

where $S_{34}$ is the distance between conductive lines 3 and 4, $W_3$ is the width of conductive line 3, $S_{23}$ is the distance between conductive lines 2 and 3, $W_2$ is the width of the conductive line 2, $S_{12}$ is the distance between conductive lines 1 and 2, and $W_1$ is the width of the conductive line 1. If the spacing between the lines is equal to the width of the conductive lines, the formulas for $L_{min}$ and $L_{max}$ may become simplified to:

$$L_{min} = 3S \text{ (or } 3W\text{)}$$

$$L_{max} = 11S \text{ (or } 11W\text{)}$$

Where S is the spacing between any adjacent lines and W is the width of any conductive line. Thus, if the line widths are about 0.25 μm and the spacing between the lines is about 0.25 μm, then $L_{min} \equiv 0.75$ μm and $L_{max} \equiv 2.75$ μm.

FIG. 11 depicts a situation where a defect causes a short between all of the conductive lines. The presence of this type of defect may be initially determined by an SEM inspection of the test structure. As described above, the presence of such a defect may be determined by noticing a breakdown in the alternating pattern of glowing and darkened conductive lines. In this case a voltage contrast inspection of all of the conductive lines in the vicinity of the defect will appear darkened. This situation is different from the situation in which two defects cause shorts between the first and second lines and the third and fourth conductive lines. If two defects, at two different locations, cause a short between the grounded and ungrounded conductive lines, the visual pattern may appear different than a situation in which a single defect spans all four conductive lines. As mentioned above, a defect spanning all of the conductive lines will cause the conductive lines to become darkened in the vicinity of the defect. If two separate defects, at two different locations, cause shorting of the ungrounded lines to the grounded lines, the darkening of the ungrounded lines will only occur in the vicinity of the defect. Thus, within a narrow scan region of the test structure, a defect which spans four conductive lines may be differentiated from a pair, or more, of defects which cause grounding of the non-conductive lines.

After the defect has been detected, a series of electrical tests may be performed. In the case depicted in FIG. 11, a short is electrically detected between all of the conductive lines. Thus, electrical testing of lines 1 to 2, 1 to 3 and 1 to 4 should reveal electrical connectivity between all of the lines. This electrical detection, in conjunction with the voltage contrast inspection, may verify the presence of a defect which, minimally, connects all four conductive lines.

Assuming the defect is roughly circular, the minimum possible length of a defect which causes a short between all of the conductive lines is depicted in FIG. 11. The defect extends from an outer surface 322 of conductive line 1 to an outer surface 324 of conductive line 4. The minimum possible length may be represented by the formula:

$$L_{min} = S_{12} + W_2 + S_{23} + W_3 + S_{34}$$

where $S_{12}$ is the distance between conductive lines 1 and 2, $W_2$ is the width of the conductive line 2, $S_{23}$ is the distance between conductive lines 2 and 3, $W_3$ is the width of the conductive line 3, and $S_{34}$ is the distance between conductive lines 3 and 4. If the spacing between the lines is equal to the width of the conductive lines, the formulas for $L_{min}$ may be simplified to:

$$L_{min} = 5S \text{ (or } 5W\text{)}$$

Where S is the spacing between any adjacent lines and W is the width of any conductive line. Thus, if the line widths are about 0.25 μm and the spacing between the lines is about 0.25 μm, then $L_{min} \equiv 1.25$ μm.

The spacing and line widths of the conductive lines of the test structure may be varied to allow a greater range of defect sizes to be determined. By reducing the line width and/or the spacing of the conductive lines, narrow defect size ranges may be detected. Alternatively, the width and spacing of the conductive lines may be increased such that a broad range of defect sizes may be determined. The spacing between the conductive lines, as well as the width of the conductive lines, need not be the same for each conductive line. By customizing the test structure in this manner, information about the defect size may be readily obtainable.

It will be appreciated to those skilled in the art having the benefit of this disclosure that both the test structure and the method for using a test structure described herein are capable of applications with numerous types of conductive lines formed on an integrated circuit topography. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claim be interpreted to embrace all such modifications and changes and, accordingly the specification and drawings are to be regarded in an illustrative rather than a restrictive sense.

What is claimed is:

1. A test structure for detecting the presence of defects in conductive features formed on an integrated circuit topography, comprising:

a first conductive line formed upon the integrated circuit topography, wherein the first conductive line is selectively connected to ground or disconnected from ground by a transistor coupled to the first conductive line; and a second conductive line formed upon the integrated circuit topography, wherein the second conductive line is floating;

wherein the first conductive line comprises a main portion and projections extending from the main portion, and wherein the second conductive line substantially surrounds the projections such that a distance between the second conductive line and the first conductive line is substantially constant.

2. The test structure of claim 1, further comprising a pad coupled to the transistor, wherein the pad is configured to receive an electrical testing probe, and wherein applying the voltage to the pad causes the transistor to disconnect the first conductive line from the ground.

3. The test structure of claim 1 further comprising:
a third conductive line formed upon the integrated circuit topography, wherein the third line is coupled to the ground; and
a substantially ungrounded fourth conductive line formed upon the integrated circuit topography.

4. The test structure of claim 3, further comprising a first transistor coupled to the first conductive line and a second transistor coupled to the third conductive line, wherein the first transistor is configured to couple the first conductive line to ground, and wherein the first transistor is configured to disconnect the first conductive line from the ground when a voltage is applied to the first transistor, and wherein the second transistor is configured to couple the third conductive line to ground, and wherein the second transistor is configured to disconnect the third conductive line from the ground when a voltage is applied to the second transistor.

5. The test structure of claim 4, further comprising a pad coupled to the first transistor and the second transistor, wherein the pad is configured to receive an electrical testing probe, and wherein applying a voltage to the pad causes the first transistor to disconnect the first conductive line from the ground and the second transistor to disconnect the third conductive line from ground.

6. The test structure of claim 3, wherein the first and fourth conductive lines each comprise a main portion and projections extending from the main portion, and wherein the second and third conductive lines surround the projections of the first and fourth conductive lines such that a first distance between the first conductive line and the second conductive line is substantially constant, and wherein a second distance between the first conductive line and third conductive line is substantially constant, and wherein a third distance between the fourth conductive line and the second conductive line is substantially constant, and wherein a fourth distance between the fourth conductive line and the third conductive line is substantially constant.

7. The test structure of claim 3, wherein the first, second, third and fourth conductive lines have a width substantially equal to a width of the conductive features.

8. The test structure of claim 3, wherein widths of the first, second, third and fourth conductive lines are substantially constant.

9. The test structure of claim 3, wherein the first, second, third and fourth conductive lines are formed from a material comprising a metal conductor or silicided polysilicon.

10. The test structure of claim 3, further comprising testing pads coupled to the conductive lines, wherein the testing pads are configured to receive an electrical testing probe.

11. The test structure of claim 3, wherein spacing between the first, second, third and fourth conductive third lines is substantially equal.

12. The test structure of claim 4, wherein the first and second transistors are depletion-mode transistors.

13. A test structure for detecting the presence of defects in conductive features formed on an integrated circuit topography comprising:

a first conductive line formed upon the integrated circuit topography, the first conductive line comprising a main portion and projections extending from the main portion;

a first transistor coupled to the main portion of the first conductive line, wherein the first transistor is configured to couple the first conductive line to ground, and wherein the first transistor is configured to disconnect the first conductive line from the ground when a first voltage is applied to the first transistor;

a substantially ungrounded second conductive line formed upon the integrated circuit topography, wherein the second conductive line substantially surrounds the projections of the first conductive line such that a distance between the second conductive line and the first conductive line is substantially constant;

a third conductive line formed upon the integrated circuit topography at a constant distance from the second conductive line;

a second transistor coupled to the third conductive line, wherein the second transistor is configured to couple the third conductive line to the ground, and wherein the second transistor is configured to disconnect the third conductive line from the ground when a second voltage is applied to the second transistor;

a pad coupled to the first and second transistors, wherein the pad is configured to receive an electrical testing probe, and wherein applying a voltage of sufficient magnitude to the pad causes the first and second transistors to disconnect the first and third conductive lines from the ground; and a fourth conductive line formed upon the integrated circuit topography at a constant distance from third conductive line, the fourth conductive line comprising a main portion and projections extending from the main portion.

14. The test structure of claim 13, wherein the second and fourth conductive lines are configured to emit more electrons than the first and third conductive lines when the test structure is irradiated with electrons.

15. A method for detecting defects in a conductive feature formed on an integrated circuit topography comprising:

forming a test structure on the integrated circuit topography, the test structure comprising:
a first conductive line formed upon the integrated circuit topography, wherein the first conductive line is selectively grounded by a transistor connected to the first conductive line and a voltage applied to the transistor; and
a substantially ungrounded second conductive line formed upon the integrated circuit topography;

irradiating the test structure with electrons; and
inspecting the test structure while the test structure is irradiated with electrons.

16. The method of claim 15, wherein inspecting the test structure comprises comparing an electron emission of the first conductive line to an electron emission of the second conductive line, wherein an extra material defect is detected when the electron emission of the second conductive line is substantially equal to the electron emission of the first conductive line.

17. The method of claim 15, wherein inspecting the test structure comprises using a scanning electron microscope to scan the test structure.

18. The method of claim 15, wherein inspecting the test structure comprises inspecting an area less than the total area of the test structure.

19. The method of claim 15, wherein inspecting the test structure comprises:

inspecting a first portion of the test structure, the first portion comprising a first area less than the total area of the test structure; and inspecting a second portion of the test structure, the second portion comprising a second area less than the total area of the test structure;

wherein the first area and the second area combined are less than the total area of the test structure.

20. The method of claim 19 wherein inspecting the test structure comprises comparing an electron emission of the first conductive line to an electron emission of the second conductive line, and wherein an MMD is detected when the electron emission of the first conductive line is substantially equal to the electron emission of the second conductive line when inspecting the first portion of the test structure, and wherein the electron emission of the second conductive line is greater than the electron emission of the first conductive line when inspecting the second portion of the test structure.

21. The method of claim 15, further comprising:

applying a voltage to the transistor such that the first conductive line is disconnected from ground;

electrically testing for the presence of an extra material defect between the first and second conductive lines; and electrically testing for the presence of a missing material defect along the first and second conductive lines.

22. A method for detecting defects in a conductive feature formed on an integrated circuit topography comprising:

forming a test structure on the integrated circuit topography, the test structure comprising:

a first conductive line formed upon the integrated circuit topography, the first conductive line comprising a main portion and projections extending from the main portion;

a first transistor coupled to the main portion of the first conductive line, wherein the first transistor is configured to couple the first conductive line to ground, and wherein the first transistor is configured to disconnect the first conductive line from the ground when a first voltage is applied to the first transistor;

a substantially ungrounded second conductive line formed upon the integrated circuit topography, wherein the second conductive line substantially surrounds the projections of the first conductive line such that a distance between the second conductive line and the first conductive line is substantially constant;

a third conductive line formed upon the integrated circuit topography at a constant distance from the second conductive line;

a second transistor coupled to the third conductive line, wherein the second transistor is configured to couple the third conductive line to ground, and wherein the second transistor is configured to disconnect the third conductive line from the ground when a second voltage is applied to the second transistor;

a pad coupled to the first and second transistors, wherein the pad is configured to receive an electrical testing probe, and wherein applying a voltage to the pad causes the first and second transistors to disconnect the first and third conductive lines from the ground; and;

a fourth conductive line formed upon the integrated circuit topography at a constant distance from third conductive line, the fourth conductive line comprising a main portion and projections extending from the main portion;

irradiating the test structure with electrons; and inspecting the test structure while the test structure is irradiated with electrons.

23. The method of claim 22, wherein inspecting the test structure comprises comparing an electron emission of the first and third conductive lines to an electron emission of the second and fourth conductive lines, and wherein an extra material defect is detected when the electron emission of at least one of the second conductive line and the fourth conductive line is substantially equal to the electron emission of the first and third conductive lines.

24. The method of claim 22, wherein inspecting the test structure comprises:

inspecting a first portion of the test structure, the first portion comprising a first area less than the total area of the test structure; and inspecting a second portion of the test structure, the second portion comprising a second area less than the total area of the test structure;

wherein the first area and the second area combined are less than the total area of the test structure.

25. The method of claim 22, further comprising:

applying a voltage to the pad such that the first and third conductive lines are disconnected from ground;

electrically testing for the presence of an extra material defect between the conductive lines; and electrically testing for the presence of a missing material defect.

26. A method for determining a defect size distribution of an extra material defect comprising:

forming a test structure on an integrated circuit topography, the test structure comprising:

a first conductive line formed upon the integrated circuit topography;

a first transistor coupled to the first conductive line, wherein the first transistor couples the first conductive line to ground, and wherein the first transistor is configured to disconnect the first conductive line from the ground when a voltage is applied to the first transistor;

a substantially ungrounded second conductive line formed upon the integrated circuit topography, wherein the second conductive line is positioned a first distance from the first conductive line;

a third conductive line formed upon the integrated circuit topography at a second distance from the second conductive line;

a second transistor coupled to the third conductive line, wherein the second transistor is configured to couple the third conductive line to ground, and wherein the second transistor is configured to disconnect the third conductive line from the ground when a voltage is applied to the second transistor;

a fourth conductive line formed upon the integrated circuit topography at a third distance from third conductive line, the fourth conductive line comprising a main portion and projections extending from the main portion;

irradiating the test structure with electrons;

inspecting the test structure while the test structure is irradiated with electrons;

electrically testing the conductive lines to determine the size of an extra material defect.

27. The method of claim 26, wherein the first distance, the second distance, and the third distance are substantially equal.

28. The method of claim 26, wherein inspecting the test structure comprises comparing an electron emission of the first and third conductive lines to an electron emission of the second and fourth conductive lines, and wherein an extra material defect is detected when the electron emission of at least one of the second conductive line and the fourth conductive line is substantially equal to the electron emission of the first and third conductive lines.

29. The method of claim 26, further comprising applying sufficient voltage to the pad such that the first and third conductive lines are disconnected from ground prior to electrically testing the conductive lines.

30. The method of claim 26, wherein electrically testing the conductive lines comprises testing for shorts between the conductive lines.

* * * * *